United States Patent [19]
Jain

[11] Patent Number: 5,821,168
[45] Date of Patent: Oct. 13, 1998

[54] PROCESS FOR FORMING A SEMICONDUCTOR DEVICE

[75] Inventor: Ajay Jain, Austin, Tex.

[73] Assignee: Motorola, Inc., Schaumburg, Ill.

[21] Appl. No.: 895,017

[22] Filed: Jul. 16, 1997

[51] Int. Cl.⁶ .................................................. H01L 21/00
[52] U.S. Cl. .............................. 438/692; 216/18; 216/38; 216/88; 438/627; 438/628; 438/633
[58] Field of Search ................................ 438/626, 627, 438/628, 633, 692, 693, 697, 748; 216/18, 38, 39, 56, 88

[56] References Cited

U.S. PATENT DOCUMENTS

| | | | |
|---|---|---|---|
| 5,332,691 | 7/1994 | Kinoshita et al. | 437/192 |
| 5,604,158 | 2/1997 | Cadien | 438/692 X |
| 5,741,626 | 4/1998 | Jain et al. | |

OTHER PUBLICATIONS

Ting et al. "The Use of Titanium–Based Contact Barrier Layers in Silicon Technology", Thin Solid Films, 96, Electronics and Optics, pp. 327–345 (1982).

Vogt et al. "Plasma Deposited Dielectric Barriers for Cu Metallization", Electrochemical Society Proceedings, vol. 96–12, pp. 613–622 (1996).

Author Anonymous, "Forming Tungsten–Nitrogen Films Using Plasma Etching", Research Disclosure 298087, Feb. 1989 and Abstract.

Mikagi, et al. "Barrier Metal Free Copper Damascene Interconnection Technology Using Atmospheric Copper Reflow and Nitrogen Doping in SiOF Film", IEEE, International Electron Devicese, Meeting, pp. 395–468 (1996).

Bai, et al., "Effectiveness and Reliability of Metal Diffusion Barriers for Copper Interconnects", Mat. Res. Soc. Symp. Proc., vol. 403, pp. 501–506 (1996).

*Primary Examiner*—William Powell
*Attorney, Agent, or Firm*—George R. Meyer

[57] ABSTRACT

A process for forming a semiconductor device (68) in which an insulating layer (52) is nitrided and then covered by a thin adhesion layer (58) before depositing a composite copper layer (62). This process does not require a separate diffusion barrier as a portion of the insulating layer (52) has been converted to form a diffusion barrier film (56). Additionally, the adhesion layer (58) is formed such that it can react with the interconnect material resulting in strong adhesion between the composite copper layer (62) and the diffusion barrier film (56) as well as allow a more continuous interconnect and via structure that is more resistant to electromigration.

21 Claims, 5 Drawing Sheets

PROCESS FOR FORMING A SEMICONDUCTOR DEVICE

FIELD OF THE INVENTION

This invention relates in general to processes for forming semiconductor devices with interconnects, and more particularly, processes for forming semiconductor devices with inlaid interconnects.

BACKGROUND OF THE INVENTION

Currently, semiconductor devices are being scaled to very small dimensions, such as less than 0.25 microns. As the device sizes decrease, the contact openings are also becoming narrower. Part of the problem with semiconductor devices that operate at high speeds is that they essentially require use of low resistance copper interconnects. However, copper diffuses through most oxides resulting in dielectric breakdown and increased line-to-line current leakages. Therefore, use of copper requires a barrier layer to be placed between the copper and the adjacent insulating layer. The barrier layer needs to be formed along the walls and bottom of the contact openings. When the size of the contact openings becomes too small, the percentage of the cross-sectional area occupied by the barrier layer becomes too large. As the ratio of barrier layer to copper increases, the effective resistance of the interconnect increases. This greater resistance is adverse to forming a high speed semiconductor device.

One prior art attempt to solve the problem is to nitridize a silicon oxyfluoride layer and deposit a copper layer over the nitrided layer. This process has problems related to adhesion. Copper does not sufficiently adhere to the nitrided silicon oxyfluoride. Poor adhesion between the nitrided silicon oxyfluoride and copper is a serious manufacturing concern because it results in peeling of copper during polish steps. Furthermore, this process uses a high temperature copper reflow (higher than 400 degrees Celsius) which requires long thermal cycling. Consequently, multi-level copper cannot be fabricated using this process because of the poor adhesion or high temperature reflow.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION

A process has been developed in which an insulating layer is nitrided and then covered by a thin adhesion layer before depositing a composite copper layer. This invention has the benefit of not requiring a separate diffusion barrier as a portion of the insulating layer has been converted to form a diffusion barrier film. Additionally, the adhesion layer is formed such that it can react with the interconnect material resulting in strong adhesion between the composite copper layer and the diffusion barrier film as well as allow a more continuous interconnect and via structure that is more resistant to electromigration. The present invention is better understood with the detailed description of the embodiments that follow.

Figure 1:
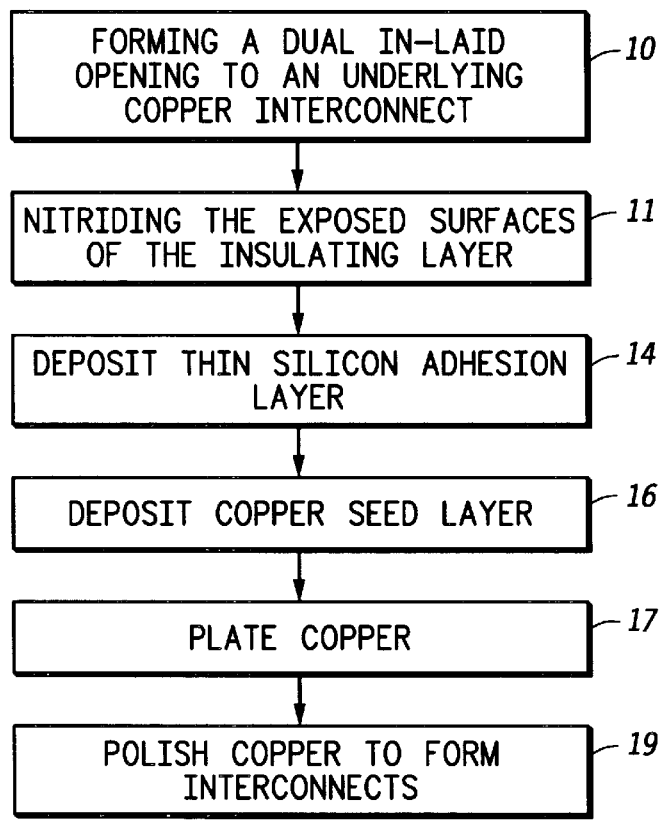
FIG. 1 includes a process flow diagram for an embodiment of the present invention.

FIG. 1 includes a process flow diagram for an embodiment of the present invention. A semiconductor device has been processed to the point at which a first level of interconnects has been formed. Typically, this first level of interconnects includes copper. One or more insulating films is deposited to form an insulating layer that is then patterned to form a dual inlaid opening that extends to the underlying copper interconnect, as seen in step 10. After forming the opening, the exposed surfaces of the insulating layer are then exposed to a nitrogen plasma which converts a portion of the insulating layer into a nitrided oxide film that is a diffusion barrier layer for copper, as seen in step 11. After the nitriding step, a thin silicon adhesion layer is deposited over all of the exposed surfaces, as seen in step 14. A copper seed layer is deposited by physical vapor deposition over the silicon adhesion layer, as seen in step 16. The substrate is removed from the tool, and a thick copper layer is plated over the copper seed layer, as seen in step 17. After plating, the substrate is then polished so that the copper only lies within the openings to form the dual inlaid structures that include via and interconnect portions, as seen in step 19.

Figure 2:
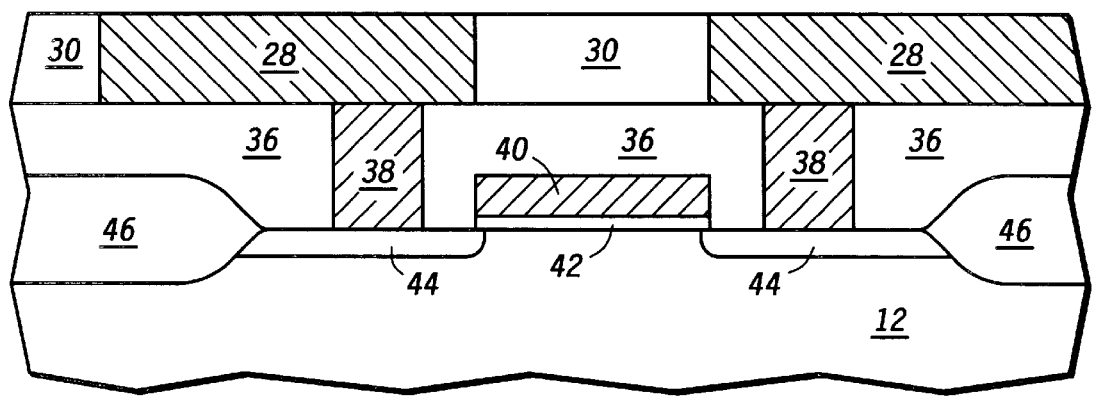
FIG. 2 includes an illustration of a cross-sectional view of a portion of a semiconductor device substrate after forming a first interconnect level.

This process will be described in more detail in reference to the cross-sectional illustrations that follow. FIG. 2 includes an illustration of a cross-sectional view of a portion of a semiconductor device substrate 12 after forming a first level of interconnects 28. The semiconductor device substrate 12 is any substrate used to form a semiconductor device. The semiconductor device substrate 12 includes field isolation regions 46 and doped regions 44 that are formed from a portion of the substrate 12. A gate dielectric layer 42 and a gate electrode 40 overlie the substrate 12 and a portion of the doped regions 44. An interlevel dielectric (ILD) layer 36 is formed over substrate 12 and planarized. The ILD layer 36 is patterned to include contact openings in which conductive plugs 38 are formed. A first insulating layer 30 is formed and patterned to include interconnect channels in which interconnects 28 are formed. In this particular embodiment, the interconnects 28 include copper, but in other embodiments could include tungsten, aluminum, or the like.

Figure 3:
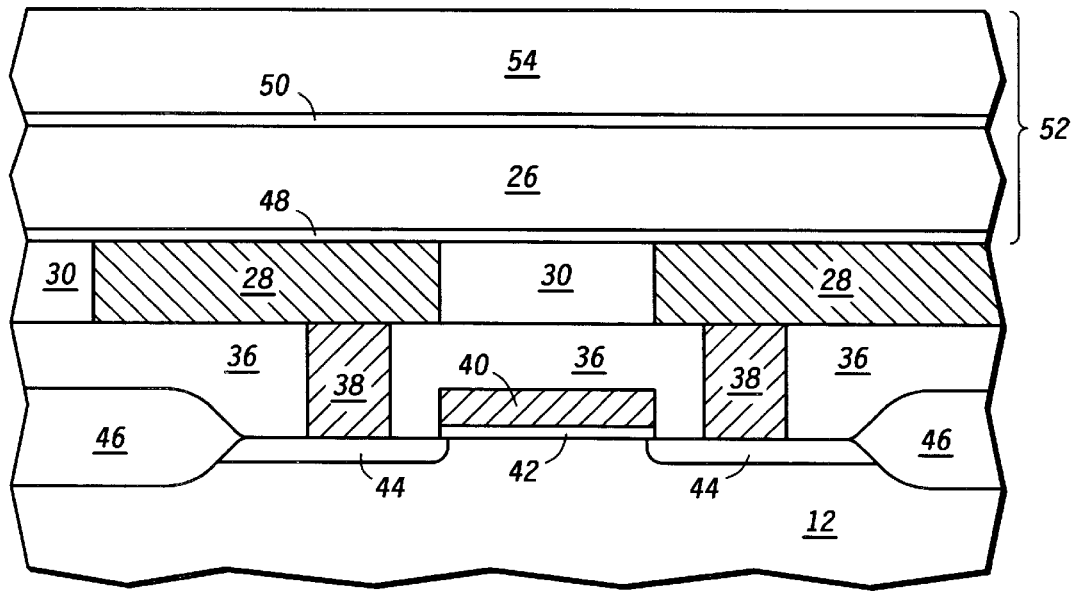
FIG. 3 includes an illustration of a cross-sectional view of the substrate of FIG. 2 after forming an insulating layer.

A second insulating layer 52 is then formed over the substrate 12 and interconnects 28 as illustrated in FIG. 3. This insulating layer 52 includes four discrete insulating films. The lower insulating film 48 is a passivation and anti-reflective coating made of plasma enhanced nitride having a thickness in a range of approximately 200–700 angstroms. An oxide film 26 is then deposited over the plasma-enhanced nitride film. The oxide film typically has a thickness in the range of 4,000–10,000 angstroms. An optional etch-stop film 50 made of silicon oxynitride is then formed over the oxide film 26 and has a thickness in the range of 200–700 angstroms. This film 50 is also an anti-reflective coating. A second oxide film 54 is formed over the etch-stop film 50 to a thickness in a range of approximately 5,000–6,000 angstroms. The oxide films 26 and 54 can be formed using tetraethylorthosilicate (TEOS), silicon oxyfluoride, low k dielectrics, or the like. The TEOS may be run in combination with oxygen gas in order to keep carbon incorporation at an acceptable level. As used in this specification, low k dielectrics low k dielectrics having a dielectric constant less than that of silicon dioxide (approximately 3.9). Some examples of low k dielectrics include polyimides, fluorocarbons (e.g., Teflon™), paralene, or the like.

Figure 4:
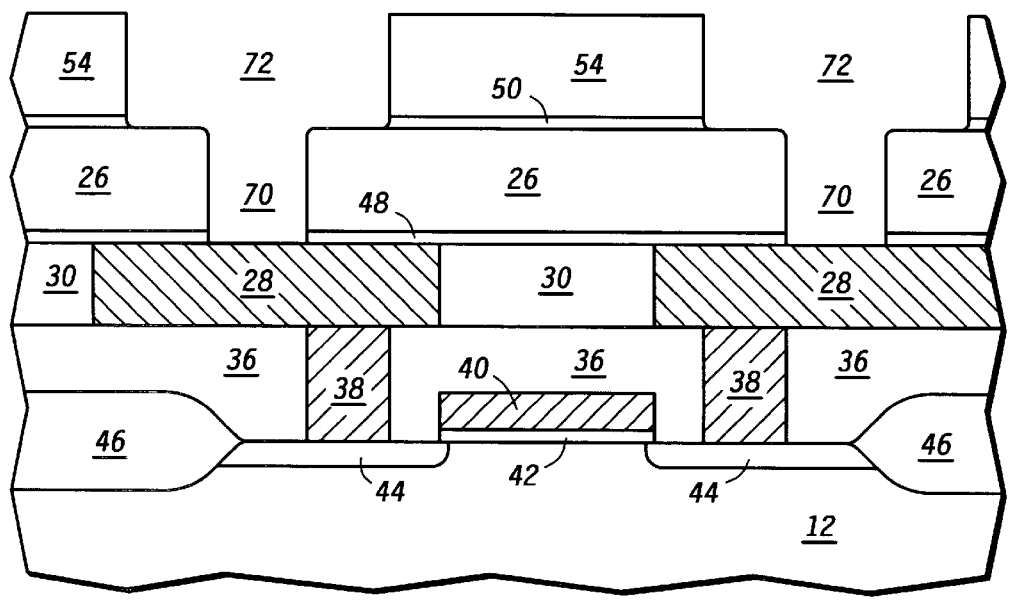
FIG. 4 includes an illustration of a cross-sectional view of the substrate of FIG. 3 after forming openings.
Figure 5:
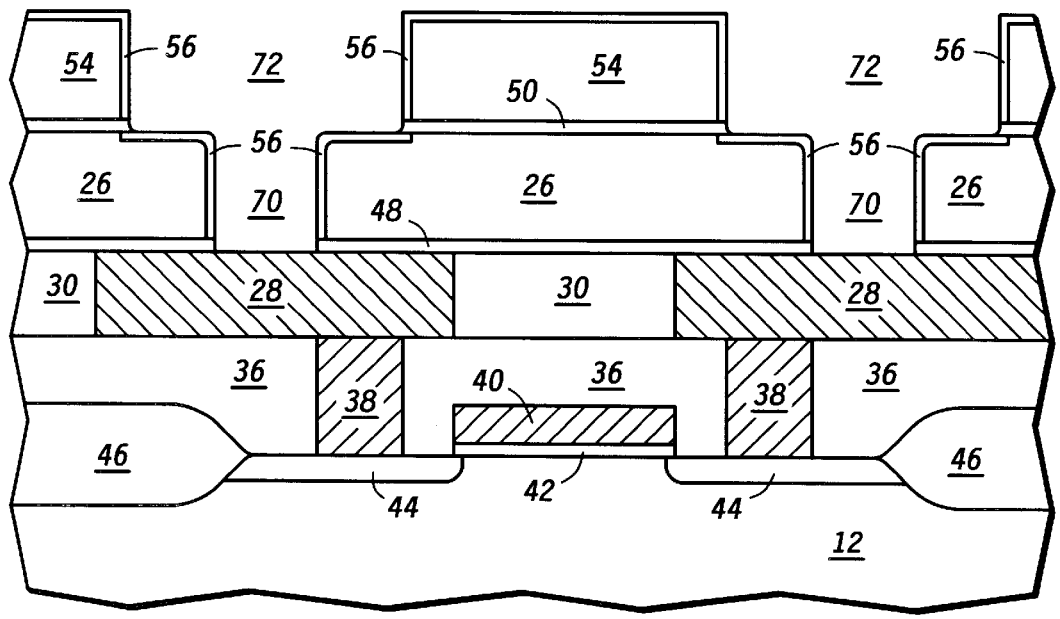
FIG. 5 includes an illustration of a cross-sectional view of the substrate of FIG. 4 after converting a portion of the insulating layer into a nitrided oxide portion.

The insulating layer 52 is then patterned using conventional techniques to form the dual inlaid openings as illustrated in FIG. 4. These dual inlaid openings include via portions 70 and interconnect channel portions 72. The via portions 70 contact the interconnects 28 and the interconnect channels 72 are routed between the vias and other circuit elements. After patterning the insulating layer 52 to form the dual inlaid openings, the exposed surfaces of the oxide layer are then converted to silicon oxynitride diffusion barrier portions 56, as illustrated in FIG. 5, by performing a plasma nitriding step.

In one particular embodiment, this step is performed using relatively high power plasma in a range of approximately 500–1,500 watts. Typically, the plasma includes a nitrogen-containing compound, such as molecular nitrogen, ammonia, or the like. Argon is used to stabilize the plasma. This step is typically performed in a range of approximately 1–3 minutes. The step converts approximately 200–300 angstroms of the exposed oxide films into the silicon oxynitride portions. The plasma processing is performed at a pressure of approximately 10 millitorr to approximately 5 torr. Typically, the pressure is in a range of approximately 500–2,000 millitorr. Lower pressures may not properly convert the sidewall portions of the insulating layer 52 into substantially thick silicon oxynitride portions. Therefore, higher pressures are typically preferred, but at too high of a pressure, the plasma may become unstable. In an alternate embodiment, a boron-containing species, such as diborane or the like, may be used to form the diffusion barrier portions that include silicon boroxide.

Figure 6:
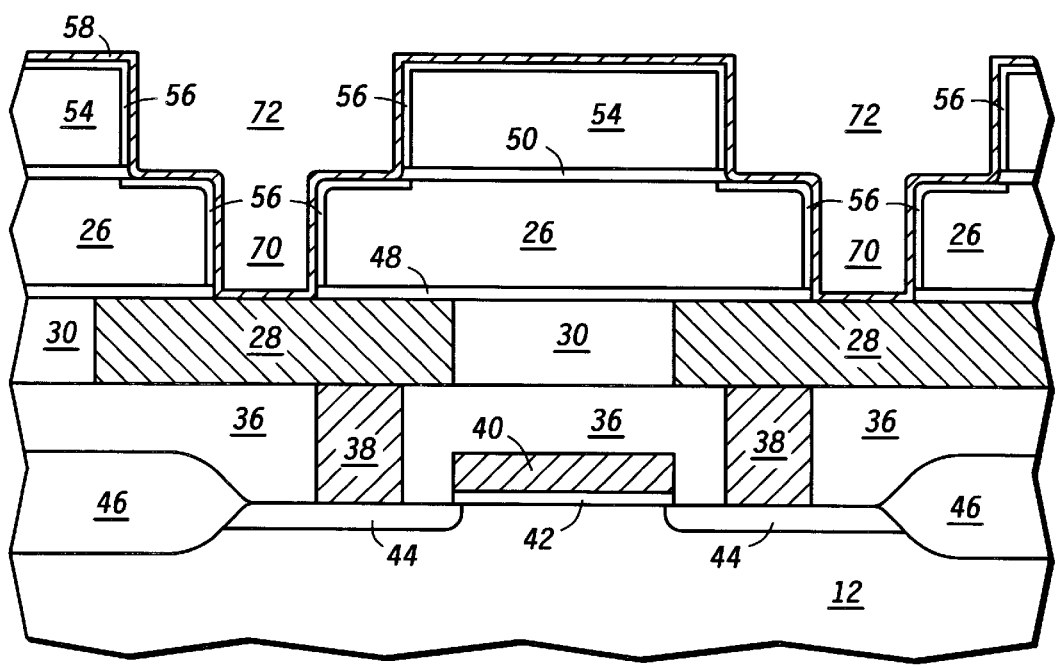
FIG. 6 includes an illustration of a cross-sectional view of the substrate of FIG. 5 after forming a silicon adhesion layer.

As illustrated in FIG. 6, a silicon adhesion layer 58 is then formed over the nitrided oxide portions 56 and has a thickness in a range of approximately 50–150 angstroms. Typically, the adhesion layer 58 includes silicon, silicon germanium, germanium, or the like. In alternate embodiments, the adhesion layer 58 can include magnesium, titanium, or the like. Generally, the adhesion layer 58 needs to react with the subsequently formed copper layer to provide a strong adhesion between the copper and the nitrided oxide portions 56. Other benefits of the reaction will be explained later in this detailed description.

The deposition parameters for the silicon adhesion layer 58 include using silane at a flow rate in a range of approximately 50–100 standard cubic centimeters per minute. This is diluted with 10 parts nitrogen for each part of silane. The pressure of the deposition is typically in a range of approximately 50 millitorr to approximately 5 torr. More specifically, the deposition is typically performed at a pressure in a range of approximately 1–2 torr. The power for the plasma deposition is typically in a range of approximately 50–150 watts. The deposition temperature ranges from room (approximately 20 degrees Celsius) to over 400 degrees Celsius. The deposition rate of the amorphous silicon should be relatively slow so that its thickness can be controlled. The deposition time for the silicon layer 58 is in a range of approximately 5–10 seconds.

Figure 7:
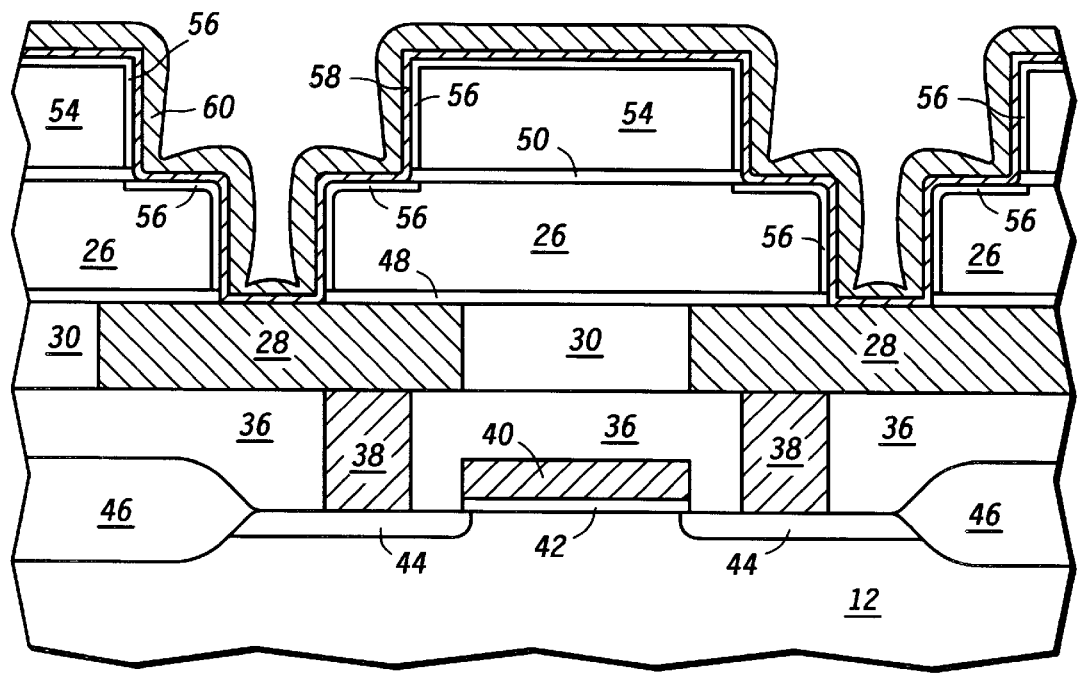
FIG. 7 includes an illustration of a cross-sectional view of the substrate of FIG. 6 after depositing a copper seed layer.

As illustrated in FIG. 7, a copper seed layer 60 is deposited by physical vapor deposition over the adhesion layer 58 using a collimated sputtering chamber. A continuous film is formed along all portions of the opening including its walls. In many embodiments, the thickness of this layer is in a range of approximately 50–150 angstroms along the wall near the very bottom of the via portion of the opening. In order to attain this, the copper seed layer 60 is deposited to a thickness of approximately 3,000 angstroms over the insulating layer 52. The substrate is then removed from the tool at which time the vacuum is broken. Note that between the time of the barrier film 56 formation through the copper seed layer 60 formation, the substrate has been under continuous vacuum.

Figure 8:
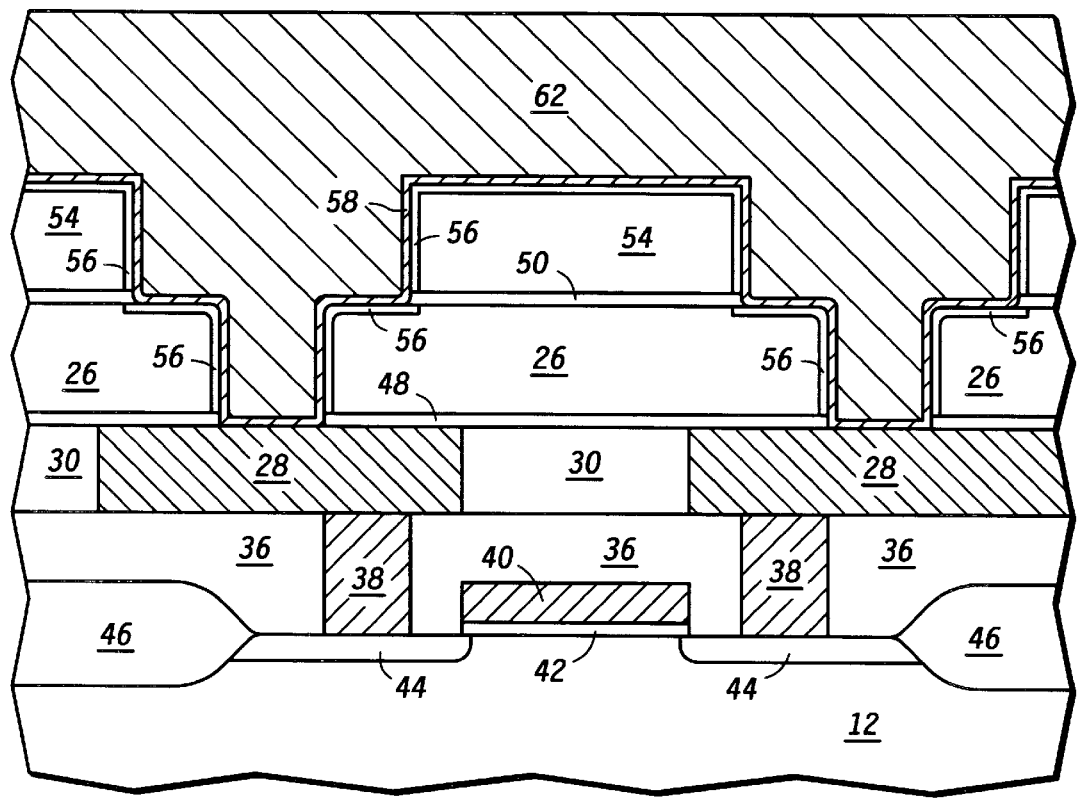
FIG. 8 includes an illustration of a cross-sectional view of the substrate of FIG. 7 after plating a copper layer over the copper seed layer.
Figure 9:
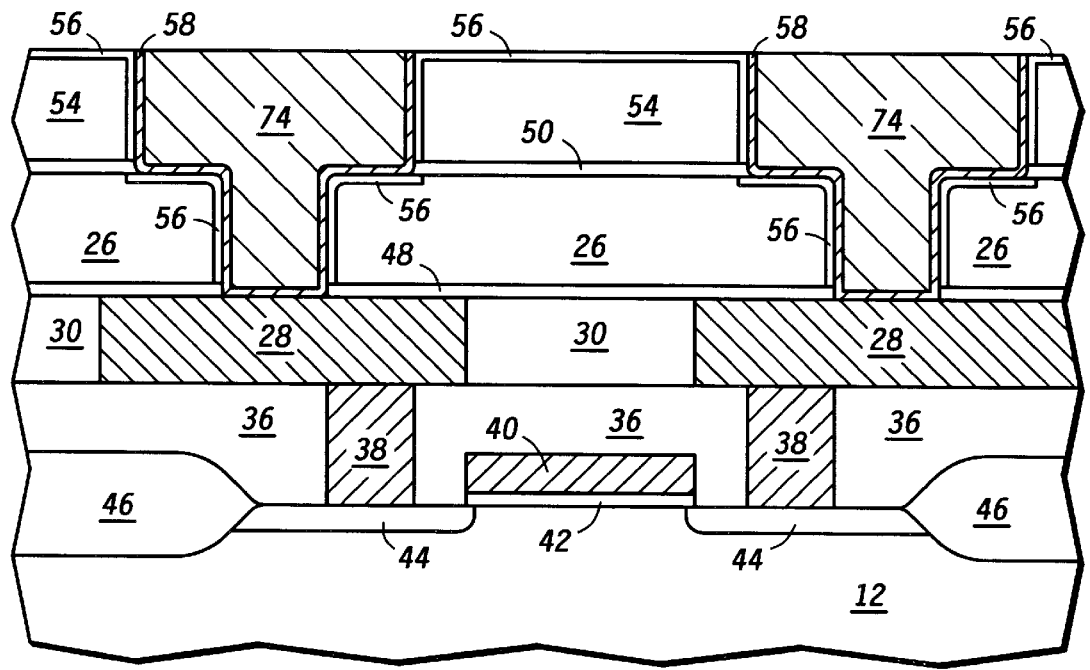
FIG. 9 includes an illustration of a cross-sectional view of the substrate of FIG. 8 after polishing the silicon adhesion and copper layers.

The substrate is then taken to an electroplating system where 6,000–15,000 angstroms of copper is plated over the copper seed layer 60, as seen in FIG. 8. The copper seed layer 60 can no longer be distinguished from the electroplated copper layer, thus forming a composite copper layer 62 overlying the adhesion layer 58. As illustrated in FIG. 9, the portions of the adhesion layer 58 and the composite copper layer 62 that overlie the uppermost surface of the insulating layer 52 are then removed by chemical-mechanical polishing. At this point, dual inlaid structures 74 have been formed that include both via portions and interconnect channel portions, which allows electrical connections to be made to various parts of the semiconductor device.

Figure 10:
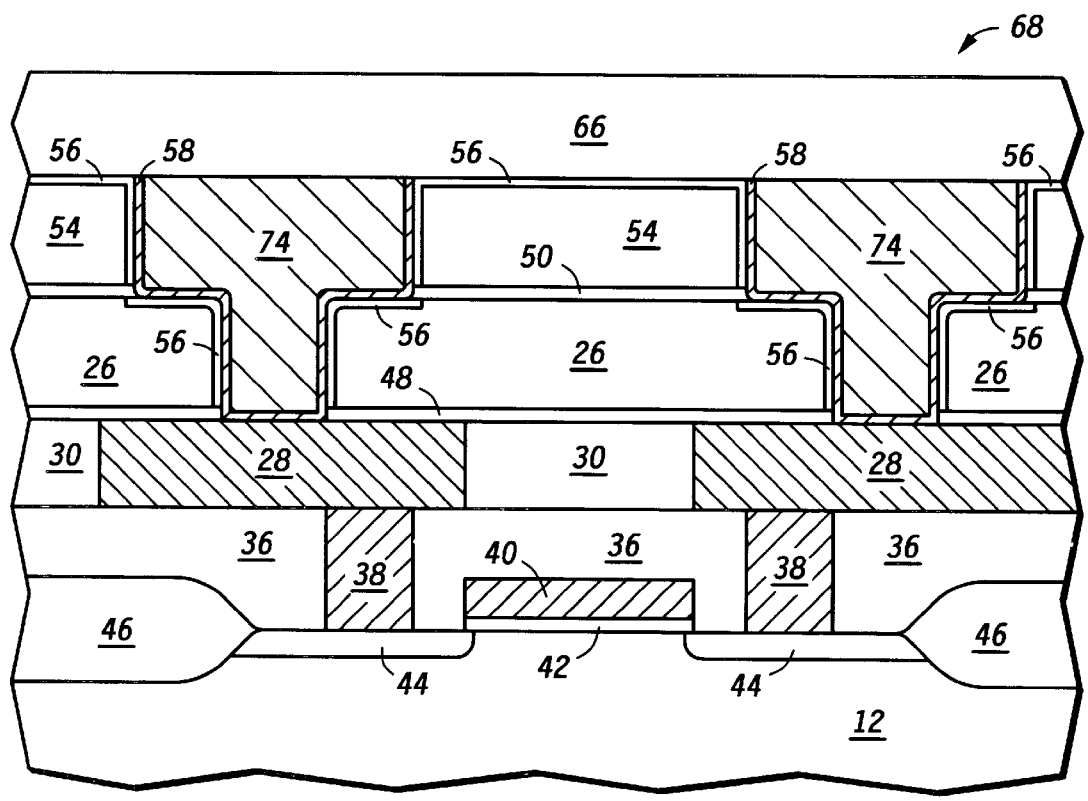
FIG. 10 includes an illustration of a cross-sectional view of the substrate of FIG. 9 after forming a substantially completed device.

As seen in FIG. 10, following the formation of the dual inlaid structures 74, a passivation layer 66 is then formed over the semiconductor device 68 including the dual inlaid structures 74. At this point in time, a substantially completed semiconductor device 68 has been formed. Optionally, other interconnect levels similar to the one just described could be formed overlying the dual inlaid structures 74, but are not illustrated in the figures.

The dual inlaid structures can be modified to be a single inlaid interconnect structure in which only interconnect channels are formed. For example, the process previously described could be modified to apply to the upper insulating layer 30 of the first level interlevel dielectric to form the interconnect channels for interconnects 28. In this embodiment, the upper insulating layer 30 would be nitrided to convert portions of this layer 30 into diffusion barrier portions (not shown in the figures) similar to the diffusion barrier portions 56. A silicon adhesion layer, similar to adhesion layer 58, would then be formed over the diffusion barrier portions, followed by a copper seed layer. Copper would then be plated over the copper seed layer to form a composite copper layer. The silicon adhesion layer overlying the nitrided portions of the upper insulating layer 30 and the composite copper layer are not illustrated in the figures. The bottom of the interconnect channel 28 would now contact the conductive plug 38 and lie over the ILD layer 36.

After forming this single inlaid structure, a passivation layer could be formed over the upper insulating layer 30 and the interconnects 28. Alternatively, additional ILD layers and interconnect levels could be formed before depositing the passivation layer.

In still other embodiments, the copper seed layer 60 and electroplated copper layer may be replaced by a single copper layer. This may be achieved by plasma vapor deposition, chemical vapor deposition, or the like. Further, other materials can replace copper for the interconnect materials. Those other materials, for example, gold or the like, can adversely interact with oxygen or have species that diffuse through oxide layers.

The present invention includes benefits over the prior art methods. More specifically, the present invention has an adhesion layer 58 that allows the composite copper layer 62 to adhere to the adhesion layer 58 that adheres to the nitrided oxide portions 56. In this manner, the polishing conditions do not have to be tightly controlled to reduce the likelihood of peeling. Additionally, the process does not require a titanium nitride or other metallic nitride barrier layer. In electromigration tests, such a structure with the metallic nitride barrier layer typically prevents copper from flowing or migrating between the interconnect and via portion of the dual inlaid structure. This can cause the copper within the via portion to deplete, thereby creating a void and rendering the interconnect structure as an electrical open. With an embodiment of the present invention, the adhesion layer is selected so that the adhesion layer can react with the copper layer. In this manner, the copper layer will react with the adhesion layer at the bottom of the opening, allowing the copper to migrate between the interconnect and the via portion of the dual inlaid structure. Therefore, some embodiments of the present invention should make the wiring system more robust and less likely to have a failure due to electromigration reasons.

Another benefit over the prior art is that if a supplementary diffusion layer is used, it can be made thinner because the diffusion barrier portions 56 are being formed from a portion from the insulating layer 52. By nitriding the insulating layer to form the diffusion barrier portions 56, a supplementary diffusion barrier layer, such as a thin titanium nitride layer and the like, may be formed along the walls. In this manner, the titanium nitride layer would be no more than 200 angstroms thick near the bottom of the contact openings, compared to prior art methods which would have a titanium nitride barrier layer of at least 300 angstroms along the walls of the contact opening near the bottom of the contact opening. As the contact openings continue to decrease in size, the thickness of this barrier layer should also decrease in order for the resistance through the via portion to remain acceptable.

Another benefit of the embodiments of the present invention, is that they can be used to form a copper layer with larger copper grains. The larger copper grains are more resistant to electromigration compared to smaller grains as seen with a PVD copper system that has been reflowed. Additionally, the plating of the copper layer can be controlled better and be formed such that no voids are formed within the dual inlaid structure. Also, the upper surface after plating can be relatively planar compared to the PVD system followed by a copper reflowing step.

Still another benefit of the embodiments of the present invention is that they can be performed using existing technology without having to develop a marginal process or use exotic materials.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

I claim:

1. A process for forming a semiconductor device comprising the steps of:

forming a patterned insulating layer over a substrate, wherein the patterned insulating layer includes an opening;

converting a portion of the patterned insulating layer to a barrier film;

depositing an adhesion layer over the barrier film; and forming a conductive metal-containing layer over the adhesion layer.

2. The process of claim 1, wherein the step of forming the patterned insulating layer is performed such that the patterned insulating layer is formed using tetraethylorthosilicate.

3. The process of claim 1, wherein the step of converting comprises exposing the insulating layer to a material selected from a group consisting of a nitrogen-containing species and a boron-containing species.

4. The process of claim 3, wherein the step of converting is performed using a plasma.

5. The process of claim 4, wherein the step of converting uses the plasma at a power in a range of approximately 500 watts to approximately 1500 watts.

6. The process of claim 1, wherein the step of converting is performed such that the barrier film has a thickness in a range of approximately 200 angstroms to approximately 300 angstroms.

7. The process of claim 1, wherein the step of depositing is performed such that the adhesion layer includes a material selected from a group consisting of silicon, magnesium, and titanium.

8. The process of claim 7, wherein the step of depositing is performed such that the adhesion layer has a thickness in a range of approximately 50 angstroms to approximately 150 angstroms.

9. The process of claim 1, wherein the step of forming the conductive metal-containing layer is performed such that the conductive metal-containing layer is at least approximately half copper.

10. The process of claim 9, wherein the step of forming the conductive metal-containing layer comprises the steps of depositing a first copper layer and plating a second copper layer over the first copper layer, wherein the second copper layer is thicker than the first copper layer.

11. The process of claim 10, further comprising the step of removing the first and second copper layers that overlie an uppermost surface of the patterned insulating layer.

12. The process of claim 10, wherein the step of removing is performed using chemical-mechanical polishing.

13. The process of claim 1, further comprising the step of depositing a passivation layer over the conductive metal-containing layer.

14. A process for forming a semiconductor device comprising the steps of:
- forming a patterned insulating oxide layer over a substrate, wherein the patterned insulating oxide layer includes a dual inlaid opening over an underlying interconnect;
- converting a portion of the patterned insulating oxide layer into a nitrided oxide portion using a nitrogen-containing plasma;
- depositing a silicon layer over the nitrided oxide portion;
- forming a conductive metal-containing layer over the silicon layer, wherein the conductive metal-containing layer is at least approximately half copper; and
- polishing the conductive metal-containing layer to remove that portion of the conductive metal-containing layer that overlies an uppermost surface of the patterned insulating oxide layer.

15. The process of claim 14, wherein the step of converting is performed such that the nitrogen-containing plasma is performed at a power in a range of approximately 500 watts to approximately 1500 watts.

16. The process of claim 15, wherein the step of converting is performed such that the nitrided oxide has a thickness in a range of approximately 200 angstroms to approximately 300 angstroms.

17. The process of claim 14, wherein the step of depositing is performed such that the silicon layer has a thickness in a range of approximately 50 angstroms to approximately 150 angstroms.

18. The process of claim 14, further comprising the step of depositing a passivation layer over the conductive metal-containing layer after the step of polishing.

19. The process of claim 14, wherein the step of forming a conductive metal-containing layer is performed such that the metal-containing layer includes a first copper layer and a second copper layer overlying the first copper layer, wherein the second copper layer is thicker than the first copper layer.

20. The process of claim 19, wherein:
- the step of depositing the silicon layer is performed using chemical vapor deposition; and
- the step of forming the metal-containing layer comprises the steps of:
  - physical vapor depositing the first copper layer; and
  - plating the second copper layer over the first copper layer.

21. The process of claim 14, wherein the step of depositing the silicon layer is performed using a plasma at a power in a range of approximately 50 watts to approximately 150 watts.

* * * * *